(12) United States Patent
Wang

(10) Patent No.: US 7,297,629 B2
(45) Date of Patent: Nov. 20, 2007

(54) ULTRA-THICK METAL-COPPER DUAL DAMASCENE PROCESS

(75) Inventor: Sung-Hsiung Wang, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 277 days.

(21) Appl. No.: 10/942,555

(22) Filed: Sep. 15, 2004

(65) Prior Publication Data

US 2006/0057842 A1  Mar. 16, 2006

(51) Int. Cl.
*H01L 21/4763* (2006.01)
(52) U.S. Cl. ........................... 438/638; 438/687
(58) Field of Classification Search ............. 438/638
See application file for complete search history.

(56) References Cited

U.S. PATENT DOCUMENTS 5,926,732 A * 7/1999 Matsuura ................ 438/622
6,204,168 B1 * 3/2001 Naik et al. .............. 438/638
6,211,069 B1 * 4/2001 Hu et al. ................ 438/637
6,287,960 B1 * 9/2001 Lao ....................... 438/637
6,350,682 B1 * 2/2002 Liao ....................... 438/638

* cited by examiner

*Primary Examiner*—Stephen W. Smoot
(74) *Attorney, Agent, or Firm*—Tung & Associates

(57) ABSTRACT

Novel dual damascene methods characterized by short cycle time and low expense. In one embodiment, the method includes providing a dielectric layer on a substrate; etching a via in the dielectric layer; filling the via with a conductive metal such as copper; providing a second dielectric layer over the via; etching a trench in the second dielectric layer; and filling the trench with a conductive metal such as copper. In another embodiment, the method includes providing a dielectric layer on a substrate; etching a partial via in the dielectric layer; etching a partial trench in the dielectric layer over the partial via; completing the via and the trench in a single etching step; and filling the via and the trench with a conductive metal such as copper to complete the via and metal line, respectively.

20 Claims, 3 Drawing Sheets

ULTRA-THICK METAL-COPPER DUAL DAMASCENE PROCESS

FIELD OF THE INVENTION

The present invention relates to dual damascene processes used to form copper lines and vias in the fabrication of semiconductor integrated circuits. More particularly, the present invention relates to novel dual damascene processes which are characterized by low cost and short cycle times.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

In the semiconductor industry, copper is being increasingly used as the interconnect material for microchip fabrication. The conventional method of depositing a metal conducting layer and then etching the layer in the pattern of the desired metal line interconnects and vias cannot be used with copper because copper is not suitable for dry-etching. Special considerations must also be undertaken in order to prevent diffusion of copper into silicon during processing. Therefore, the dual-damascene process has been developed and is widely used to form copper metal line interconnects and vias in semiconductor technology. In the dual-damascene process, the dielectric layer rather than the metal layer is etched to form trenches and vias, after which the metal is deposited into the trenches and vias to form the desired interconnects. Finally, the deposited copper is subjected to chemical mechanical planarization (CMP) to remove excess copper (copper overburden) extending from the trenches.

While there exist many variations of a dual-damascene process flow, the process typically begins with deposition of a silicon dioxide dielectric layer of desired thickness which corresponds to the thickness for the via or vias to be etched in the dielectric layer. Next, a thin etch stop layer, typically silicon nitride, is deposited on the dielectric layer. Photolithography is then used to pattern via openings over the etch stop layer, after which dry etching is used to etch via openings in the etch stop layer. The patterned photoresist is then stripped from the etch stop layer after completion of the etch. A remaining dielectric layer the thickness of which corresponds to the thickness of the trench for the metal interconnect lines is then deposited on the etch stop layer, and photolithography followed by dry etching is used to pattern the trenches in the remaining dielectric layer and the vias beneath the trenches. The trench etching stops at the etch stop layer, while the vias are etched in the first dielectric layer through the openings in the etch stop layer and beneath the trenches. Next, a barrier material of Ta or TaN is deposited on the sidewalls and bottoms of the trenches and vias using ionized PVD. A uniform copper seed layer is then deposited on the barrier layer using CVD. After the trenches and vias are filled with copper, the copper overburden extending from the trenches is removed and the upper surfaces of the metal lines planarized using CMP. In the dual damascene process described above, the vias and the trenches are etched in the same step, and the etch stop layer defines the bottom of the trenches. In other variations, the trench is patterned and etched after the via.

A significant advantage of the dual-damascene process is the creation of a two-leveled metal inlay which includes both via holes and metal line trenches that undergo copper fill at the same time. This eliminates the requirement of forming the trenches for the metal interconnect lines and the holes for the vias in separate processing steps. The process further eliminates the interface between the vias and the metal lines.

Another important advantage of the dual-damascene process is that completion of the process typically requires 20% to 30% fewer steps than the traditional aluminum metal interconnect process. Furthermore, the dual damascene process omits some of the more difficult steps of traditional aluminum metallization, including aluminum etch and many of the tungsten and dielectric CMP steps. Reducing the number of process steps required for semiconductor fabrication significantly improves the yield of the fabrication process, since fewer process steps translate into fewer sources of error that reduce yield.

While the traditional dual damascene process is attended by many advantages, some of the disadvantages include high cost, excessive process complexity and inordinately long process cycle time. Accordingly, a new and improved dual damascene process is needed which is characterized by low cost and a shorter cycle time.

Accordingly, an object of the present invention is to provide a new and improved method for fabricating metal lines and vias on a substrate.

Another object of the present invention is to provide a new and improved dual damascene process for semiconductor fabrication.

Still another object of the present invention is to provide a new and improved dual damascene process which is characterized by a short cycle time and low cost.

Yet another object of the present invention is to provide a dual damascene process which includes fabricating vias on a substrate followed by fabrication of metal lines in conductive communication with the vias.

A still further object of the present invention is to provide a dual damascene process which includes formation of a partial via; completion of the via and formation of a trench above the via in a single step; and filling of the via and trench with copper to complete the metal line and via on the substrate.

SUMMARY OF THE INVENTION

In accordance with these and other objects and advantages, the present invention is generally directed to novel dual damascene methods characterized by short cycle time and low expense. In one embodiment, the method includes providing a dielectric layer on a substrate; etching a via in the dielectric layer; filling the via with a conductive metal such as copper; providing a second dielectric layer over the via; etching a trench in the second dielectric layer; and filling the trench with a conductive metal such as copper. In another embodiment, the method includes providing a dielectric layer on a substrate; etching a partial via in the dielectric layer; etching a partial trench in the dielectric layer over the partial via; completing the via and the trench in a single etching step; and filling the via and the trench with a conductive metal such as copper to complete the via and metal line, respectively.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1A:
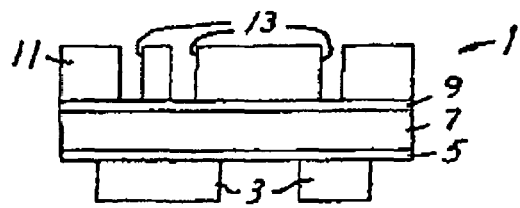
FIG. 1A is a sectional view of a dielectric layer and a patterned photoresist provided on the dielectric layer preparatory to etching of vias in the dielectric layer in a first step according to a first embodiment of the method of the present invention.
Figure 1B:
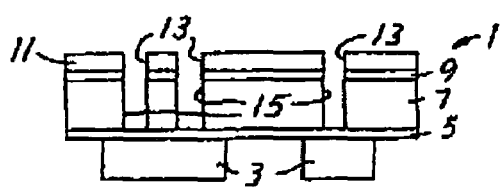
FIG. 1B is a sectional view illustrating multiple vias etched in a dielectric layer in a second step according to a first embodiment of the invention.
Figure 1C:
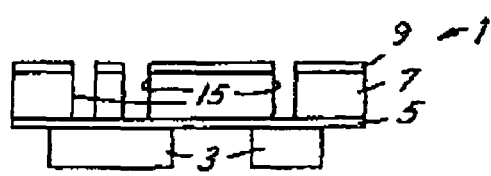
FIG. 1C is a sectional view illustrating stripping of patterned photoresist from the via-etched dielectric layer in a third step.
Figure 1D:
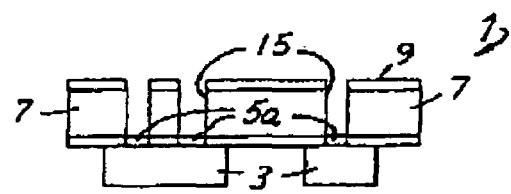
FIG. 1D is a sectional view illustrating removal of a cap hard mask layer from the dielectric layer in a fourth step.
Figure 1E:
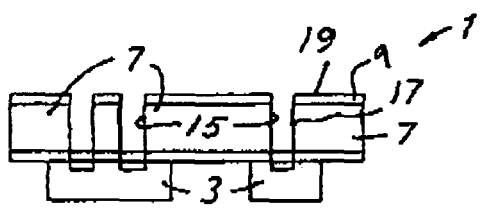
FIG. 1E is a sectional view illustrating deposition of a barrier layer and a seed layer on the dielectric layer and on the sidewalls and bottoms of the vias in a fifth step.
Figure 1F:
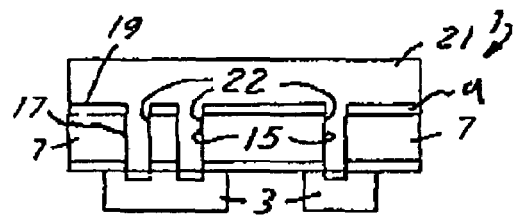
FIG. 1F is a sectional view illustrating filling of the vias with copper and deposition of a copper layer on the dielectric layer in a sixth step.
Figure 1G:
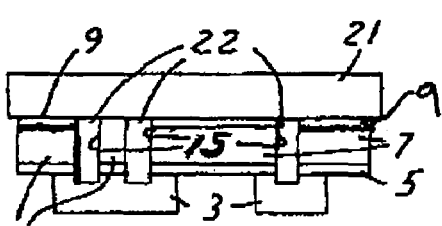
FIG. 1G is a sectional view illustrating planarization of the copper layer deposited in the step of FIG. 1F in a seventh step.
Figure 1H:
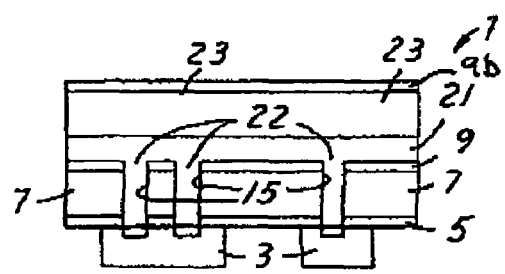
FIG. 1H is a sectional view illustrating deposition of a second dielectric layer on the planarized copper layer of FIG. 1G in an eighth step.
Figure 1I:
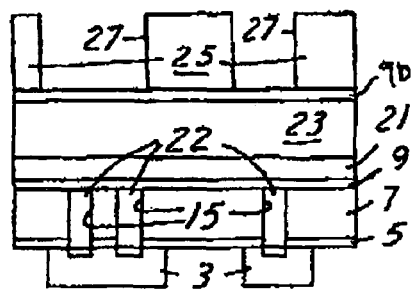
FIG. 1I is a sectional view illustrating deposition of a patterned photoresist on the second dielectric layer in a ninth step according to a desired trench pattern to be etched in the second dielectric layer.
Figure 1J:
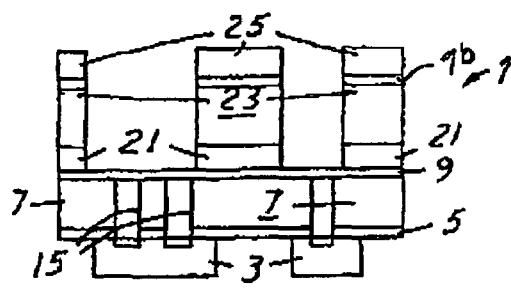
FIG. 1J is a sectional view illustrating etching of trenches in the second dielectric layer in a tenth step.
Figure 1K:
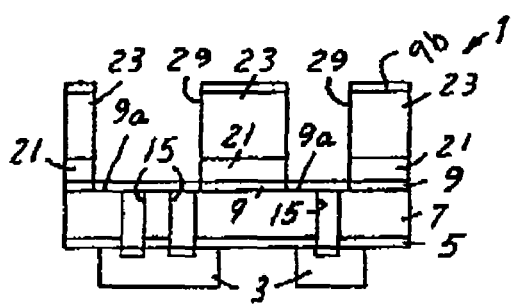
FIG. 1K is a sectional view illustrating etching of an etch stop layer between the trenches and the vias in an eleventh step.
Figure 1L:
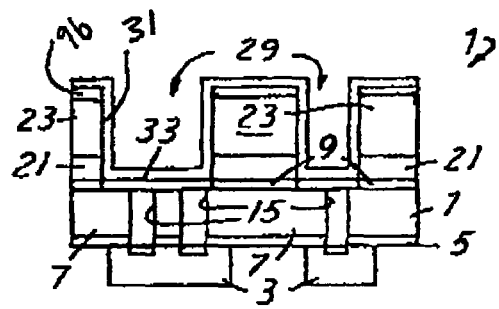
FIG. 1L is a sectional view illustrating deposition of a barrier and seed layer on the second dielectric layer and the sidewalls and bottoms of the trenches in a twelfth step.
Figure 1M:
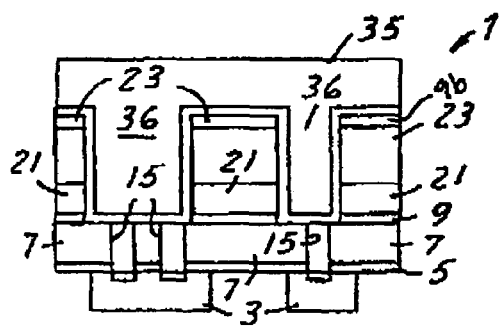
FIG. 1M is a sectional view illustrating deposition of copper in the trenches in the second dielectric layer and formation of a copper layer on the dielectric layer in a thirteenth step.
Figure 1N:
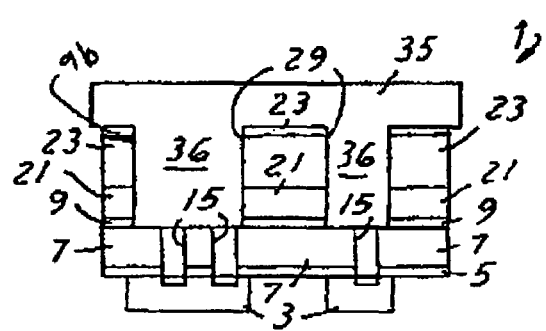
FIG. 1N is a sectional view illustrating planarization of the copper layer and completion of the process of the first embodiment in a fourteenth step.

Referring initially to FIGS. 1A-1N, in a first embodiment according to the novel dual damascene processes of the present invention, vias and metal lines are sequentially fabricated to form a metal line and via system 1. Fabrication of the system 1 according to the first embodiment begins with formation of the vias, as will be hereinafter described with respect to FIGS. 1A-1G, followed by formation of the metal lines above the vias, as will be hereinafter described with respect to FIGS. 1H-1N. The dual damascene processes of the present invention provide methods which are characterized by low cost and shortened cycle times as compared to conventional dual damascene processes.

As shown in FIG. 1A, fabrication of the system 1 includes initial deposition of a metal conductive layer 3 on a substrate (not shown). A bottom etch stop layer 5, which is typically SiN (silicon nitride), is deposited on the conductive layer 3 and has a thickness of typically about 500 angstroms. A bottom dielectric layer 7, typically SiON, is then deposited on the bottom etch stop layer 5 and may have a thickness of typically about 600 angstroms. A top etch stop layer 9, also having a thickness of typically about 500 angetroms, is then deposited on the bottom dielectric layer 7. A patterned photoresist 11, having multiple via etch exposure openings 13 which correspond positionally and dimensionally to the desired pattern for the vias to be formed in the system 1, is deposited on the top etch stop layer 9. Each of the via etch exposure openings 13 has a CD (critical dimension) size of typically about 0.38-0.40 µm.

The vies 15 are formed by etching through the top etch stop layer 9 and then the bottom dielectric layer 7 downwardly through the via etch exposure openings 13 in the patterned photoresist 11, until the etching stops at the bottom etch stop layer 5, as shown in FIG. 1B. The etch process may be a self-aligned etch process. Next, as shown in FIG. 1C, the patterned photoresist 11 is stripped from the underlying top etch stop layer 9 and then typically subjected to a wet cleaning process to remove photoresist residue therefrom, as is known by those skilled in the art. The portions of the bottom etch stop layer 5 which separate each via 15 from the underlying conductive layer 3 are then etched away to establish communication between each via 15 and the underlying conductive layer 3, as indicated by reference numeral 5a in FIG. 1D. Next, the partially fabricated system 1 is typically subjected to wet cleaning, CD measurement, AEI (after-etch inspection) and pre-bake prior to deposition of a barrier layer 17 on the sidewalls and bottom of each via 15, followed by deposition of a copper seed layer 19 on the barrier layer 17, as shown in FIG. 1E. Typically, the barrier layer 17 is TaN and has a thickness of about 300 angstroms. The copper seed layer 19 has a thickness of typically about 1,800 angstroms. Deposition of the barrier layer 17 and the seed layer 19 may be preceded and followed by charging of the processing environment with nitrogen gas. The vias 15 are then tilled with copper via infills 22, and a copper plating layer 21 which is continuous with the copper via infills 22 is deposited on the portion of the seed layer 19 which was previously deposited on the bottom dielectric layer 7. Finally, after charging of the processing environment with nitrogen, the copper plating layer 21 is subjected to CMP (chemical mechanical planarization) to planarize the copper plating layer 21, as shown in FIG. 1G.

Referring next to FIGS. 1H-1N, metal lines are then formed in the system 1 above the copper-inlaid vias 15 as follows. As shown in FIG. 1H, a top dielectric layer 23 which may be SiON, which may include an additional overlying dielectric/hard mask layer 9b, and have a thickness of typically about 600 angstroms, is initially deposited on the planarized copper plating layer 21. Next, as shown in FIG. 1I, a patterned photoresist 25, having multiple trench etch exposure openings 27 which correspond positionally and dimensionally to the desired pattern for the trenches to be etched, is deposited over the top dielectric layer 23. Each of the trench etch exposure openings 27 has a CD of typically at least about 2.5 µm. Trenches 29, each corresponding to the width and position of a corresponding one of the trench etch exposure openings 27 in the patterned photoresist 25, are then etched beneath each opening 27, through the underlying top dielectric opening 23 and the copper plating layer 21, to the top etch stop layer 9, as shown in FIG. 1J. The etch process may be a self-aligned etch process. Next, as shown in FIG. 1K, the portion of the top etch stop layer 9 which separates each trench 29 from the underlying via 15 is etched to establish communication between the vias 15 and the trenches 29, as indicated by reference numeral 9a. This is typically followed by wet cleaning to remove etch particles as well as CD measurement and AET (after-etching inspection). A barrier layer 31 is next deposited on the sidewalls and bottom of the trenches 29, as well as on the upper surface of the top dielectric layer 23, and a copper seed layer 33 is deposited on the barrier layer 31, as shown in FIG. 1L. The barrier layer 31 is typically TaN and has a thickness of about 300 angstroms, whereas the copper seed layer 33 has a thickness of typically about 1,800 angetroms. Both before and after the barrier layer 31 and the seed layer 33 are deposited, the processing environment may be charged with nitrogen. The trenches 29 are then filled with copper trench infills 36, and a copper plating layer 35 which is continuous with the copper trench infills 36 is deposited on the portion of the seed layer 33 which was previously deposited on the bottom dielectric layer 7 with the barrier layer 31. Finally, as shown in FIG. 1N, the copper plating layer 35 is subjected to CMP (chemical mechanical planarization) to substantially planarize the copper plating layer 35. Accordingly, the copper trench infills 36 define metal lines that connect devices (not shown) to each other in the integrated circuit off which the system 1 is a part, and the copper via infills 22 connect the metal lines to the underlying conductive layer 3.

Figure 2A:
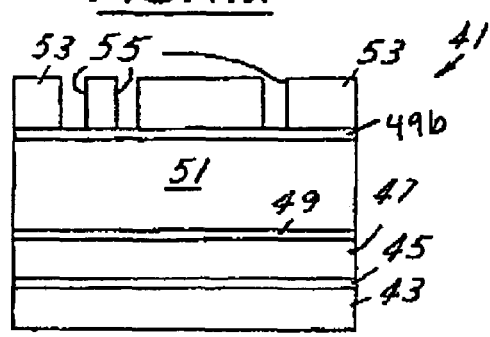
FIG. 2A is a sectional view illustrating a top dielectric layer deposited on a top etch stop layer provided on a bottom dielectric layer and a patterned photoresist layer for the formation of vias deposited on the top dielectric layer in a first step according to a second embodiment of the present invention.
Figure 2B:
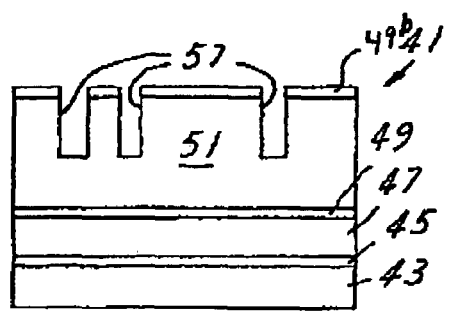
FIG. 2B is a sectional view illustrating partial vias etched in the top dielectric layer in a second step.

Referring next to FIGS. 2A-2J, in a second embodiment according to the methods of the present invention, a metal line and via system 41 is fabricated by initially depositing a bottom etch stop layer 45 on a conductive layer 43 previously deposited on a substrate (not shown) or an insulative layer (not shown), as shown in FIG. 2A. The bottom etch stop layer 45 is typically SiN (silicon nitride) and may be about 500 angstroms thick, or in the range of 300 Å-3000 Å. Next, a bottom dielectric layer 47, typically silicon dioxide $SiO_2$ and having a thickness of about 600 angstroms, or in the range of 300 Å-2000 Å, is deposited on the bottom etch stop layer 45. A top etch stop layer 49 is deposited on the bottom dielectric layer 47, and a top dielectric layer 51 is deposited on the top etch stop layer 49. An additional dielectric/hard mask layer 49b may be formed on the top dielectric layer 51 as shown in FIG. 2B. A patterned photoresist 53, having multiple via etch exposure openings 55 corresponding the positions and dimensions of vias to be etched, is deposited over the top dielectric layer 51. Each of the via etch exposure openings 55 has a CD of typically about 0.20 µm to about 2 µm.

Figure 2C:
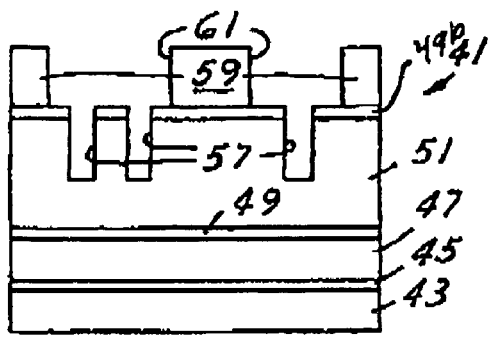
FIG. 2C is a sectional view illustrating deposition of a patterned photoresist for the formation of trenches in the top dielectric layer in a third step.
Figure 2D:
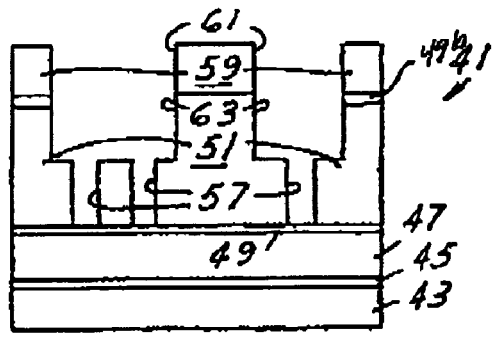
FIG. 2D is a sectional view illustrating etching of trenches in the top dielectric layer and completion of the vias to the top etch stop layer between the top dielectric layer and the bottom dielectric layer in a fourth step.
Figure 2E:
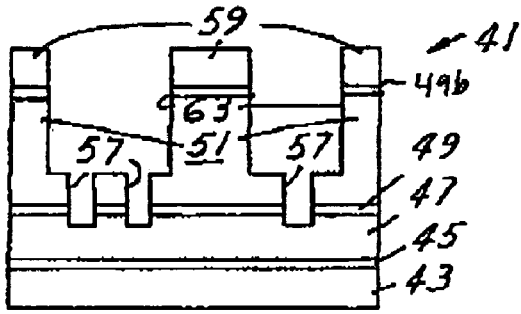
FIG. 2E is a sectional view illustrating etching of the vias through the top etch stop layer in a fifth step.
Figure 2F:
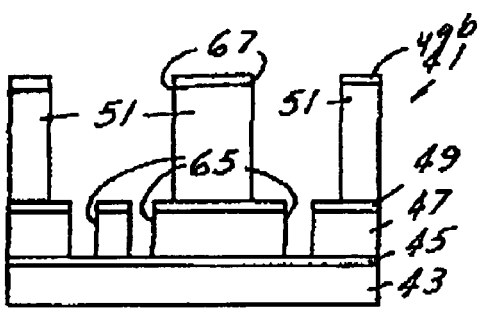
FIG. 2F is a sectional view illustrating etching of the vias through the bottom dielectric layer to a bottom etch stop layer in a sixth step.
Figure 2G:
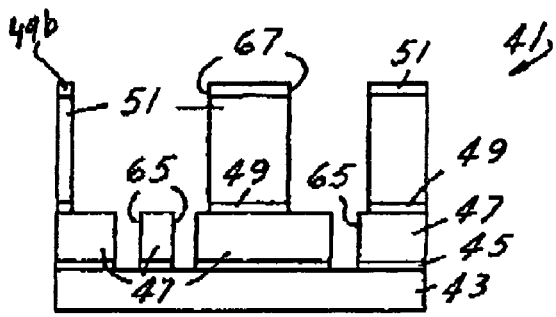
FIG. 2G is a sectional view illustrating etching of the top etch stop layer at the bottom of the trenches in a seventh step.

As shown in FIG. 2B, each of multiple partial vias 57 is then etched in the top dielectric layer 51. The etch process may be a self-aligned etch process. Next, as shown in FIG. 2C, a patterned photoresist 59, having multipie trench etch exposure openings 61 corresponding positionally and dimensionally to the respective trenches to be etched, is deposited on the top dielectric layer 51, with each trench etch exposure opening 61 disposed in communication with one or more underlying partial vias 57. The CD of each trench etch exposure opening 61 is typically at least about 0.5 µm. As shown in FIG. 2D, partial trenches 63 are then etched typically using a self-aligned etch process in the top dielectric layer 51, beneath the respective trench etch exposure openings 61. Simultaneously, the partial vias 57 are etched downwardly through the top dielectric layer 51 in advance of the downwardly-etching partial trenches 63, until the bottom ends of the partial vias 57 reach the top etch stop layer 49. Next, as shown in FIGS. 2E and 2F, the partial trenches 63 are etched through the top dielectric layer 51 to the top etch stop layer 49, at which point the partial trenches 63 define complete trenches 67. Simultaneously, the partial vias 57 are etched downwardly through the top etch stop layer 49 and the bottom dielectric layer 47, respectively, and define complete vias 65 when they reach and are stopped by the bottom etch stop layer 45. The patterned photoresist 59 is then stripped from the top dielectric layer 51, as further shown in FIG. 2F. As shown in FIG. 2G, the portion of the top etch stop layer 49 between each complete trench 67 and the underlying via or vias 65 is next etched away to expose the bottom dielectric layer 47 at the bottom of each trench 67. In similar fashion, the portion of the bottom etch stop layer 45 between each complete via 65 and the conductive layer 43 is etched away to establish communication between each complete via 65 and the underlying conductive layer 43. This is followed by wet cleaning of the system 41 typically using an ST-250 solvent, CD measurement for the complete vias 65 and the complete trenches 67, and pre-baking of the system 41.

Figure 2H:
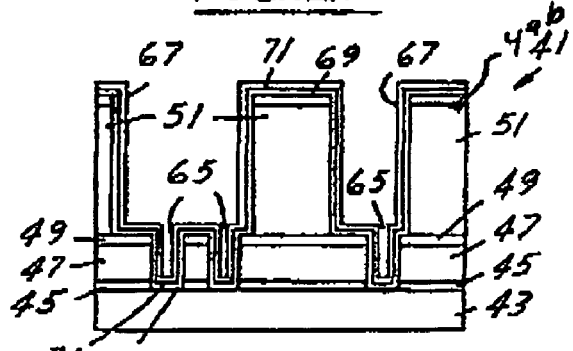
FIG. 2H is a sectional view illustrating deposition of a barrier layer and a seed layer on the sidewalls and bottoms of the trenches and vias in an eighth step.
Figure 2I:
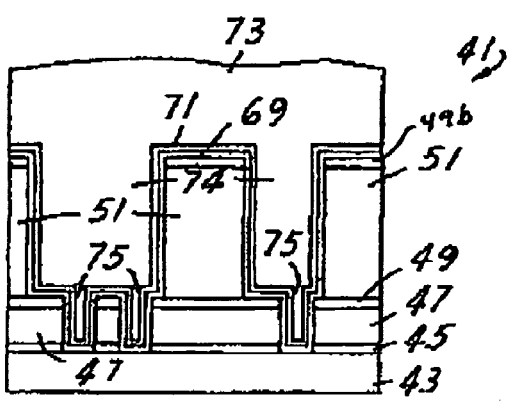
FIG. 2I is a sectional view illustrating filling of the vias and trenches with copper and deposition of a copper layer on the top dielectric layer in a ninth step.
Figure 2J:
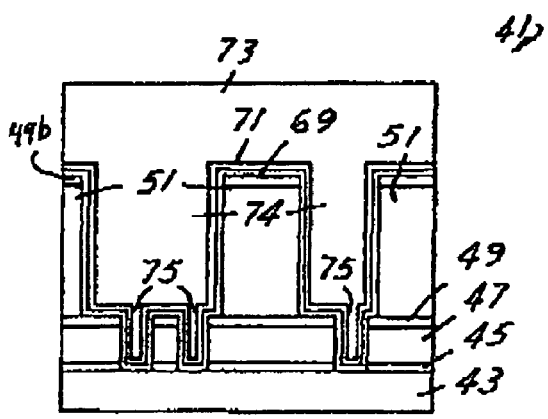
FIG. 2J is a sectional view illustrating planarization of the copper layer in a tenth step.

As shown in FIG. 2H, a barrier layer 69 is then deposited on the sidewalls of the complete vias 65 and complete trenches 67, as well as on the exposed upper surface of the top dielectric layer 51. A seed layer 71 is then deposited on the barrier layer 69. In a preferred embodiment, the barrier layer 69 is TaN and has a thickness of typically about 300 angstroms, or in the range of 200 Å-1000 Å, whereas the seed layer 71 is copper and has a thickness of typically about 1,800 angstroms, or in the range of 1000 Å-3000 Å. Next, as shown in FIGS. 2H and 2I, in a single process step the complete vias 65 are filled with respective copper trench infills 75, the complete trenches 67 are filled with copper trench infills 74, and a copper plating layer 73 which is continuous with the copper trench infills 74 is deposited on the portion of the seed layer 71 which was previously deposited on the top dielectric layer 51. Finally, as shown in FIG. 2J, the copper plating layer 73 is subjected to CMP (chemical mechanical planarization) to substantially planarize the copper plating layer 73. Accordingly, the copper trench infills 74 define metal lines that connect devices (not shown) to each other in the integrated circuit of which the system 41 is a part, and the copper via infills 75 connect the metal lines to the underlying conductive layer 43.

While the preferred embodiments of the invention have been described above, it will be recognized and understood that various modifications can be made in the invention and the appended claims are intended to cover all such modifications which may fall within the spirit and scope of the invention.

What is claimed is:

1. A method of forming a metal line and a via, comprising the steps of:
   providing a conductive layer;
   providing a bottom dielectric layer on said conductive layer;
   forming at least one via in said bottom dielectric layer;
   providing a conductive metal filling said at least one via and overlying said bottom dielectric layer;
   providing a top dielectric layer over said at least one via and said conductive metal;
   etching at least one trench in said top dielectric layer extending to said at least one conductive metal filled via; and
   providing a conductive metal in said at least one trench to define said metal line.

2. The method of claim 1 wherein said etching at least one via and said etching at least one trench each comprises a self-aligned etching process.

3. The method of claim 1 wherein said at least one via has a CD measurement of about 0.2 um to about 2 um.

4. The method of claim 3 wherein said etching at least one via and said etching at least one trench each comprises a self-aligned etching process.

5. The method of claim 1 wherein said at least one trench has a CD measurement of at least about 0.5 um.

6. The method of claim 5 wherein said etching at least one via and said etching at least one trench each comprises a self-aligned etching process.

7. The method of claim 5 wherein said at least one via has a CD measurement of about 0.2 um to about 2 um.

8. The method of claim 7 wherein said conductive metal comprises copper.

9. A method of forming a metal line and a via, comprising the steps of:
   providing a conductive layer;
   providing a bottom dielectric layer over said conductive layer;
   providing a top dielectric layer over said bottom dielectric layer
   etching at least one partial via in said top dielectric layer;
   depositing a photoresist layer over said at least one partial via;
   patterning said photoresist layer with a trench etch opening over said at least one partial via;
   etching at least one partial trench in said top dielectric layer over said at least one partial via;
   etching said at least one partial trench through said top dielectric layer while simultaneously etching said at least one partial via through said bottom dielectric layer to define at least one complete trench and one complete vial; and
   providing a metal infill in said at least one complete via and said at least one complete trench.

10. The method of claim 9 wherein said etching said at least one partial via and said etching said at least one partial trench each comprises a self-aligned etching process.

11. The method of claim 9 wherein said at least one complete via has a CD measurement of about 0.2 um to about 2 um.

12. The method of claim 11 wherein said etching said at least one partial via and said etching said at least one partial trench each comprises a self-aligned etching process.

13. The method of claim 9 wherein said at least one complete trench has a CD measurement of at least about 0.5 um.

14. The method of claim 13 wherein said etching said at least one partial via and said etching said at least one partial trench each comprises a self-aligned etching process.

15. The method of claim 13 wherein said at least one complete via has a CD measurement of about 0.2 um to about 2 um.

16. The method of claim 15 wherein said etching said at least one partial via and said etching said at least one partial trench each comprises a self-aligned etching process.

17. A method of forming a metal line and a via, comprising the steps of:
   providing a conductive layer;
   providing a bottom etch stop layer on said conductive layer;
   providing a bottom dielectric layer on said bottom etch stop layer;
   providing a top etch stop layer on said bottom dielectric layer;
   providing a top dielectric layer on said top etch stop layer;
   etching at least one partial via in said top dielectric layer;
   patterning a photoresist layer with a trench etch opening over said at least one partial via;
   etching at least one partial trench in said top dielectric layer over said at least one partial via;
   etching said at least one partial via through said top etch stop layer and said bottom dielectric layer to said bottom etch stop layer to define at least one via while simultaneously etching said at least one partial trench through said top dielectric layer to said top etch stop layer to define at least one complete trench;

removing said bottom etch stop layer at a bottom of said at least one via to expose said conductive layer to define at least one complete via; and, providing a metal infill in said at least one complete via and said at least one complete trench.

18. The method of claim 17 wherein said etching said at least one partial via and said etching said at least one partial trench each comprises a self-aligned etching process.

19. The method of claim 17 wherein said at least one complete via has a CD measurement of about 0.2 um to about 2 um.

20. The method of claim 17 wherein said at least one complete trench has a CD measurement of at least about 0.5 um.

* * * * *